(12) United States Patent
Parkin et al.

(10) Patent No.: US 6,326,637 B1
(45) Date of Patent: Dec. 4, 2001

(54) ANTIFERROMAGNETICALLY EXCHANGE-COUPLED STRUCTURE FOR MAGNETIC TUNNEL JUNCTION DEVICE

(75) Inventors: Stuart Stephen Papworth Parkin; Mahesh Govind Samant, both of San Jose, CA (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/420,213

(22) Filed: Oct. 18, 1999

(51) Int. Cl.$^7$ .................................................. H01L 29/06
(52) U.S. Cl. ............................... 257/9; 257/295; 428/694
(58) Field of Search .................................. 257/295–300, 257/9; 428/694

(56) References Cited

U.S. PATENT DOCUMENTS

| | | | |
|---|---|---|---|
| 5,287,238 | | 2/1994 | Baumgart et al. ............ 360/113 |
| 5,552,949 | | 9/1996 | Hashimoto et al. .......... 360/113 |
| 5,622,788 | * | 4/1997 | Gates, II et al. ............ 428/688 |
| 5,640,343 | | 6/1997 | Gallagher et al. ............ 365/171 |
| 5,650,958 | | 7/1997 | Gallagher et al. ............ 365/173 |
| 5,756,202 | * | 5/1998 | Van Kesteren et al. ....... 428/332 |
| 5,792,510 | * | 8/1998 | Farrow et al. ............... 427/130 |
| 5,801,984 | * | 9/1998 | Parkin ......................... 365/158 |
| 5,942,342 | * | 8/1999 | Hikosaka et al. ............ 428/694 |
| 6,005,800 | * | 12/1999 | Koch et al. .................. 365/173 |
| 6,150,045 | * | 11/2000 | Saito et al. .................. 428/692 |

FOREIGN PATENT DOCUMENTS

0717422A1  6/1996  (EP) ................. H01F/10/08
897 022 A1  *  2/1999  (EP).

* cited by examiner

*Primary Examiner*—Nathan Flynn
*Assistant Examiner*—Ahmed N. Sefer
(74) *Attorney, Agent, or Firm*—Thomas R. Berthold (57) ABSTRACT

An antiferromagnetically exchange-coupled structure for use in various types of magnetic devices, such as magnetic tunnel junctions and spin-valve giant magnetoresistance recording heads, includes an antiferromagnetic layer formed of an alloy of osmium and manganese, wherein the osmium is present in the range of approximately 10 to 30 atomic %. The antiferromagnetic layer is deposited on a non-reactive underlayer, preferably one formed of a noble metal, such as platinum, palladium or alloys thereof. The antiferromagnetic material provides a strong exchange biasing for the ferromagnetic layer that is deposited on the antiferromagnetic layer. Iridium may be added to the osmium-manganese alloy, wherein the total of osmium and iridium is in the range of the approximately 10 to 30 atomic %, to increase the blocking temperature of the antiferromagnetic material. A template layer of permalloy (nickel-iron alloy) may be formed between the underlayer and the antiferromagnetic layer to improve the growth of the osmium-manganese alloy. The resulting antiferromagnetically exchange-coupled structure exhibits very high thermal stability, i.e., the magnetoresistance of magnetic tunnel junction devices is retained even during relatively high annealing process temperatures. This allows magnetic tunnel junction devices using the structure to be used as memory cells in magnetic random access memory arrays that are formed on substrates with electronic circuitry formed by conventional high-temperature CMOS processes and which require high temperature anneals of the completed memory chips.

19 Claims, 7 Drawing Sheets

ANTIFERROMAGNETICALLY EXCHANGE-COUPLED STRUCTURE FOR MAGNETIC TUNNEL JUNCTION DEVICE

STATEMENT OF GOVERNMENT RIGHTS

The United States Government has a paid-up license in this invention and the right in limited circumstances to require the patent owner to license others on reasonable terms, as provided for by the terms of Contract No. MDA972-96-C-0030 awarded by the Defense Advanced Research Projects Agency.

TECHNICAL FIELD

This invention relates generally to magnetic tunnel junction (MTJ) magnetoresistive devices for use as read heads for reading magnetically-recorded data and as memory cells in non-volatile magnetic random access memory (MRAM) arrays, and more particularly to an improved antiferromagnetically exchange-coupled structure for the MTJ device.

BACKGROUND OF THE INVENTION

Magnetic tunnel junctions (MTJs) are devices with potential use as magnetoresistive read heads in magnetic storage applications, such as hard disk drives, and as nonvolatile storage cells for magnetic random access memory (MRAM) applications.

For both MTJ read head and MRAM applications a useful MTJ device is one comprised of two thin ferromagnetic layers separated by a very thin insulating layer, such as alumina ($Al_2O_3$), in which one of the ferromagnetic layers is fixed or "pinned" by being exchange biased (also called "exchange coupled") to a thin layer of an antiferromagnetic material. In a MTJ read head, the moment of the other ferromagnetic layer, called the "free" layer, is oriented generally perpendicularly to the moment of the pinned ferromagnetic layer in zero magnetic field and is free to rotate in the presence of magnetic fields from the recorded media. In a MTJ cell, the cell is designed to exhibit two bi-stable states in zero magnetic field in which the moment of the free ferromagnetic layer is oriented either parallel or antiparallel to the moment of the pinned ferromagnetic layer. These states, which exhibit different tunneling resistance values when current is passed perpendicularly through the device, represent the two storage states of the MTJ memory cell. In a MTJ read head application the moment of the free ferromagnetic layer is oriented generally perpendicular to the moment of the pinned ferromagnetic layer in the absence of an applied magnetic field, and rotates about this position in the presence of applied fields from the magnetic recording medium.

It is important that MTJ devices withstand fairly high temperatures during processing, For MTJ MRAM applications, if complementary metal-oxide semiconductor (CMOS) electronic devices are used with the MTJ cells the highest processing temperature will be determined by details of the particular CMOS process used. It is likely that the MTJ cells will be fabricated after the CMOS circuits have been fabricated, within the "back-end-of-line" (BEOL) process where the temperatures to which the devices are subjected are more limited, but may still be as high as ~400° C. For MTJ read heads, processing temperatures in excess of 250° C. are likely in order to hard-bake certain photoresists used in fabricating the read/write heads. The most common type of antiferromagnetic material proposed for use in MTJ devices is a Mn—Fe alloy. MTJ devices using Mn—Fe antiferromagnetic layers on a variety of underlayers have failed at temperatures as low as 250–300° C. Even for moderate anneal temperatures as low as 250° C., the MTJ devices using Mn—Fe antiferromagnetic layers are not highly thermally stable and typically the magnetoresistance of such devices is reduced. It is believed that during processing a small amount of Mn diffuses from the Mn—Fe layer to the interface between the pinned ferromagnetic layer and the alumina tunnel barrier, which reduces the Magnetoresistance of the device.

It addition to poor thermal stability, Mn—Fe has several other disadvantages, including a relatively low exchange coupling field, poor corrosion resistance, and a low blocking temperature (the temperature at which the net magnetic moment no longer has a fixed orientation).

Other antiferromagnetic materials besides Mn—Fe have been proposed for exchange biasing the pinned ferromagnetic layer in spin-valve type magnetoresistive read heads. For example, European published patent application EP-0717422 describes the use of Ir—Mn alloys, and suggests without any experimental data that Os can be one of 30 other elements (approximately 25% of the Periodic Table) to be added to the Ir—Mn alloy for the purpose of improving the corrosion resistance of the alloy. U.S. Pat. No. 5,552,949 suggests the use of X—Mn alloys, where X can be one of 10 elements, including Os, provided the X element is present in the range of 25 to 76 atomic percent in the X—Mn alloy. In both of these spin-valve head references the antiferromagnetic layer is deposited directly on top of the ferromagnetic layer.

What is needed is a MTJ device for read head and MRAM applications that uses an antiferromagnetic material that provides a high exchange coupling field and good corrosion resistance and results in a MTJ device that is thermally stable at high processing temperatures.

SUMMARY OF THE INVENTION

The invention is an antiferromagnetically exchange-coupled structure for use in various types of magnetic devices, such as magnetic tunnel junctions and spin-valve giant magnetoresistance recording heads. The structure includes an antiferromagnetic layer formed of an alloy of osmium and manganese, wherein the osmium is present in the range of approximately 10 to 30 atomic %. The antiferromagnetic layer is deposited on a non-reactive underlayer, preferably one formed of a noble metal, such as platinum, palladium or alloys thereof, with the ferromagnetic layer formed on top of the antiferromagnetic layer. The antiferromagnetic material provides a strong exchange biasing for the ferromagnetic layer that is deposited on the antiferromagnetic layer. Iridium may be added to the osmium-manganese alloy, wherein the total of osmium and iridium is the range of the approximately 10 to 30 atomic %, to increase the blocking temperature of the antiferromagnetic material. A template layer of permalloy (nickel-iron alloy) may be formed between the underlayer and the antiferromagnetic layer to improve the growth of the osmium-manganese alloy. The resulting antiferromagnetically exchange-coupled structure exhibits very high thermal stability, i.e., the magnetoresistance of magnetic tunnel junction devices is retained even during relatively high annealing process temperatures. This allows magnetic tunnel junction devices using the structure to be used as memory cells in magnetic random access memory arrays that are formed on substrates with electronic circuitry formed by conventional high-temperature CMOS processes and which require high temperature anneals of the completed memory chips.

For a fuller understanding of the nature and advantages of the present invention, reference should be made to the following detailed description taken together with the accompanying figures.

DETAILED DESCRIPTION OF THE INVENTION

Prior Art MTJ Array

Figure 1A:
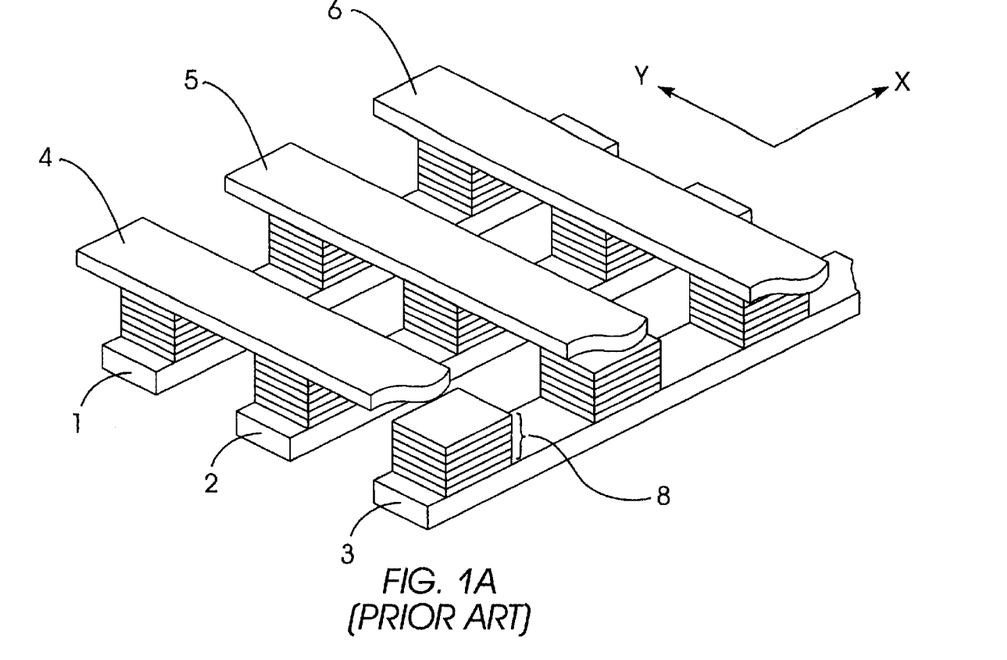
FIG. 1A depicts a prior art MTJ type of MRAM array having magnetic MTJ memory cells disposed at the intersecting regions of crossing sense lines and word lines.
Figure 1B:
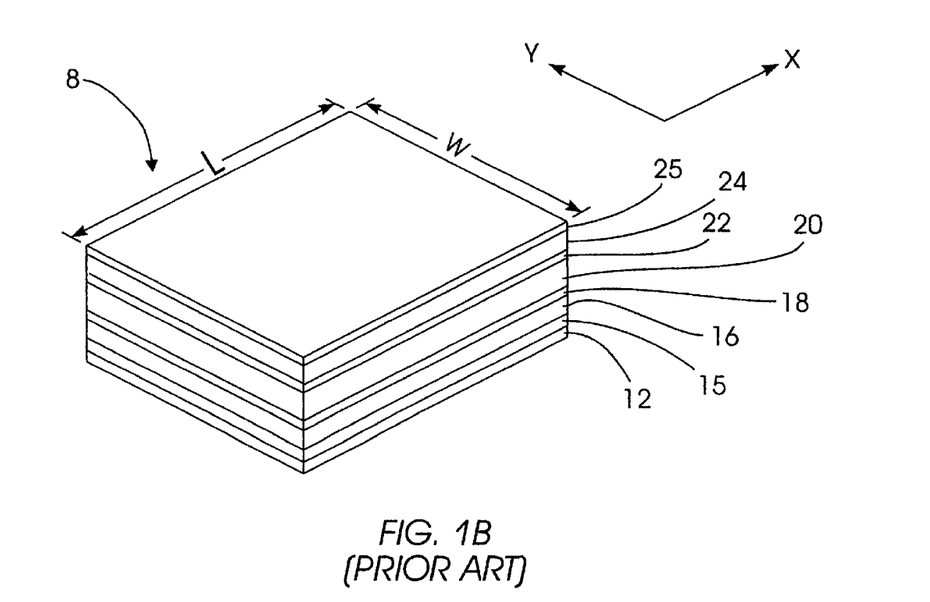
FIG. 1B depicts exemplary layers forming a single one of the magnetic MTJ memory cells of the prior art MRAM array of FIG. 1A.

An example of an MTJ MRAM array is shown in FIG. 1A, wherein the MTJ cells are positioned at the intersections of an exemplary rectangular grid of electrically conductive lines 1–6. The MRAM array includes a set of electrically conductive lines that function as parallel word lines 1, 2, and 3 in a horizontal plane, and a set of electrically conductive lines that function as parallel bit or sense lines 4, 5, and 6 in another horizontal plane. The sense lines are oriented in a different direction, e.g., at right angles to the word lines, so that the two sets of lines intersect when viewed from above. A MTJ memory cell, such as typical memory cell 8 shown in detail in FIG. 1B, is located at each crossing point of the word lines and sense lines in the intersection region vertically spaced between the lines. Three word lines and three sense lines are illustrated in FIG. 1A, but the number of lines would typically be much larger. The memory cell 8 is arranged in a vertical stack. During a sensing or reading operation of the array, current flows in a vertical direction through the cell 8. The vertical current path through the memory cell permits the memory cell to occupy a very small surface area. While not shown in FIG. 1A, the array may be formed on a substrate, such as a silicon substrate which contains other circuitry. Also, a layer of insulating material is usually located between the bit lines and word lines at regions of the MRAM array other than the intersecting regions.

As shown in FIG. 1B, the MTJ 8 is formed of a series of layers of material stacked one on top of the other. The MTJ 8 of FIG. 1B comprises an optional initial adhesion layer 12, such as Ti or Ta, an underlayer 15, such as Pt or Pd, an optional template layer of an initial ferromagnetic layer 16, such as permalloy (Ni—Fe), an antiferromagnetic (AF) layer 18, such as Mn—Fe, a fixed or "pinned" type of ferromagnetic layer 20, such as Co, Co—Fe or permalloy (Ni—Fe), that is exchange biased to the AF layer 18, a thin insulating tunnel barrier layer 22 of alumina ($Al_2O_3$), a free ferromagnetic layer 24, such as a sandwich of thin Co—Fe with permalloy, and a contact layer 25, such as Pt, Pd, Ti or Ta.

The free ferromagnetic layer 24 is fabricated to have a preferred axis for the direction of magnetization called the easy-axis. There are two possible directions of magnetization of the free layer 24 along this easy-axis which define the two states of the MTJ memory cell. In contrast, the pinned ferromagnetic layer 20 may be fabricated to have only one preferred direction of magnetization, called its unidirectional anisotropy direction, and this direction is parallel to the easy-axis of the free layer. The desired easy-axis for the free layer is set by some combination of intrinsic anisotropy, strain-induced anisotropy and shape anisotropy of the MTJ. The MTJ and free layer depicted may be made in the shape of a rectangle of length L and width W, where L is larger than W (FIG. 1B). The magnetic moment of the free layer 24 prefers to align along the direction of L. The MTJ device, such as MTJ 8 in FIG. 1B, is described in further detail in IBM's U.S. Pat. Nos. 5,650,958 and 5,640,343.

Preferred Embodiments

MTJ devices were fabricated using antiferromagnetic layers formed from alloys of Mn which are more thermally stable than Mn—Fe alloys. These antiferromagnetic layers are used with noble metal underlayers and have resulted in MTJ devices which are thermally stable to temperatures exceeding 400° C.

The MTJ structures were typically as follows:

Substrate/Seed layer/Antiferromagnetic layer/Pinned ferromagnetic layer/Insulating tunnel barrier layer/Free ferromagnetic layer/Capping layer.

Typically, the substrate was Si with a 500 nm thermally oxidized $SiO_2$ layer. The pinned ferromagnetic layer was 2.4 nm $Co_{84}Fe_{16}$, the tunnel barrier layer was 1.3 nm Al (plasma oxidized), and the free ferromagnetic layer was 8 nm $Co_{84}Fe_{16}$. These structures were grown in a high vacuum chamber with a base pressure of $\sim 2\times10^{-9}$ torr. The materials were sequentially deposited by magnetron sputtering in $3\times10^{-3}$ torr of argon (although a range of sputtering pressures was also studied). The deposited aluminum layer was oxidized to create the alumina tunnel barrier layer by plasma oxidation for approximately 120 seconds in the presence of 0.1 torr of oxygen The aluminum layer can also be oxidized by placing this layer in either air or pure oxygen or either air or oxygen with a small amount of water present. For optimum magnetoresistance the aluminum layer must be completely oxidized without oxidizing the underlying ferromagnetic electrode. The alumina layer can also be formed by reactive dc magnetron sputtering from a metallic aluminum target in a sputtering gas comprised of argon and oxygen with a predominance of argon. The amount of oxygen is chosen for optimal growth of the alumina layer without poisoning of the Al target.

A wide variety of antiferromagnetic materials have been studied and reported in the literature as exchange bias materials. For MTJ applications for which the current flows perpendicularly through the device and for which the thickness of the ferromagnetic pinned layer is very thin the antiferromagnetic material must be metallic. The metallic antiferromagnetic materials which are structurally disordered typically display exchange bias over a wide range of composition of the antiferromagnetic metal, may be less sensitive to contaminants, display exchange bias even for very thin layers at room temperature (typically as thin as ~4–5 nm), generally display exchange bias after deposition even at room temperature and require only heating above the blocking temperature of the antiferromagnetic to maximize the exchange bias. Typical examples of this type of metallic antiferromagnetic include $Fe_{1-x}Mn_x$, $Mn_{1-x}Co_x$, $Mn_{1-x}Rh_x$, $Mn_{1-x}Cr_x$ and $Ir_{1-x}Mn_x$.

Figure 2:
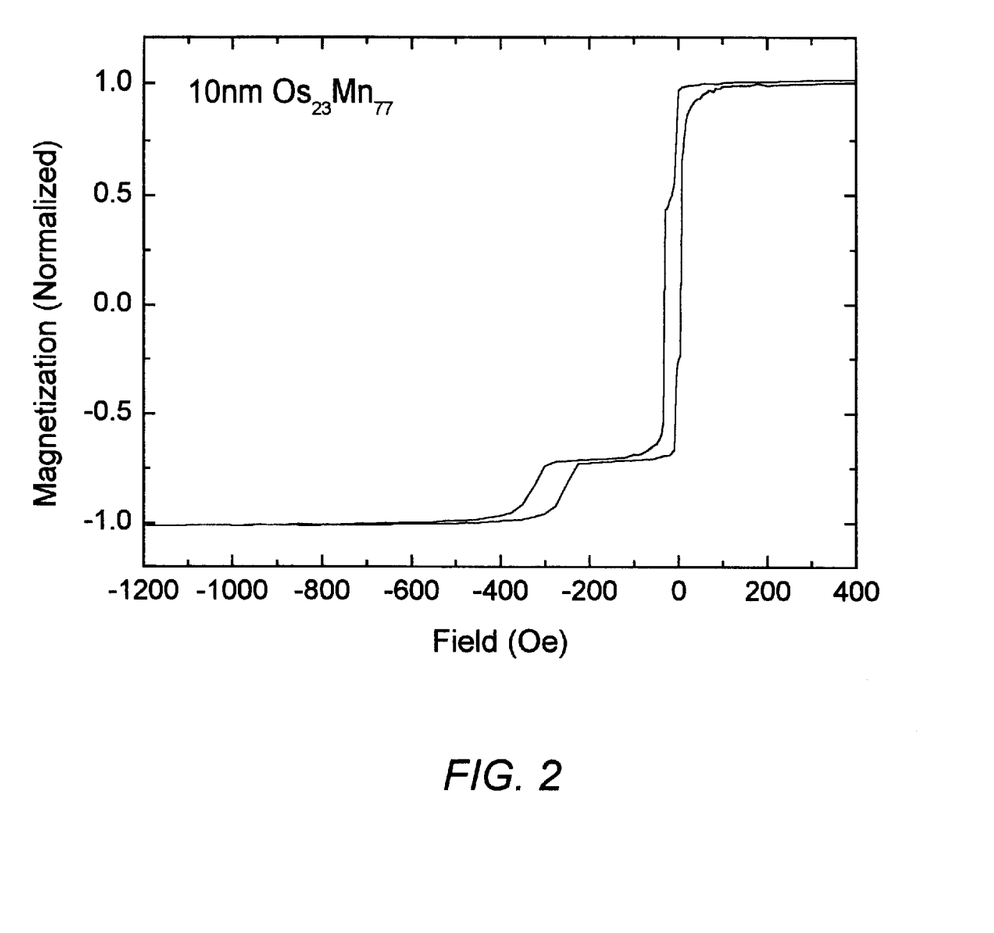
FIG. 2 is a graph of magnetization (normalized) as a function of applied magnetic field of a MTJ device with a pinned ferromagnetic layer exchange biased by 10 nm of $Os_{2.3}Mn_{77}$ formed on a Pt underlayer.

One alloy which has not previously been considered in the literature is the family of $Os_xMn_{1-x}$ alloys. In the present invention it has been demonstrated that $Os_xMn_{1-x}$ alloys do give exchange bias and that these alloys belong to the class of disordered antiferromagnetic metals. FIG. 2 shows a typical plot of magnetization versus in-plane magnetic field of an $Os_xMn_{1-x}$ exchange biased MTJ device. The structure of the sample is of the form:

5 nm Ta/15 nm Pt/10 nm $Os_{23}Mn_{77}$/2.4 nm $Co_{84}Fe_{16}$/ xAl/8 nm $Co_{84}Fe_{16}$/20 nm Pt.

Figure 3A:
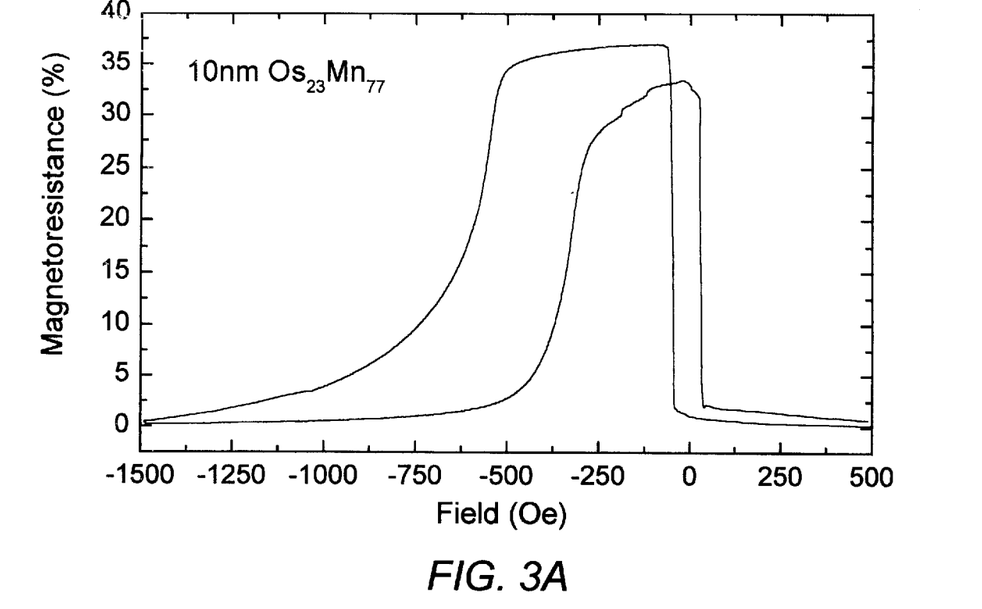
FIG. 3A is a graph of magnetoresistance as a function of in-plane magnetic field over a range capable of switching both the pinned and free layer for a MTJ device with a pinned ferromagnetic layer exchange biased by 10 nm of $Os_{23}Mn_{77}$ formed on a Pt underlayer.
Figure 3B:
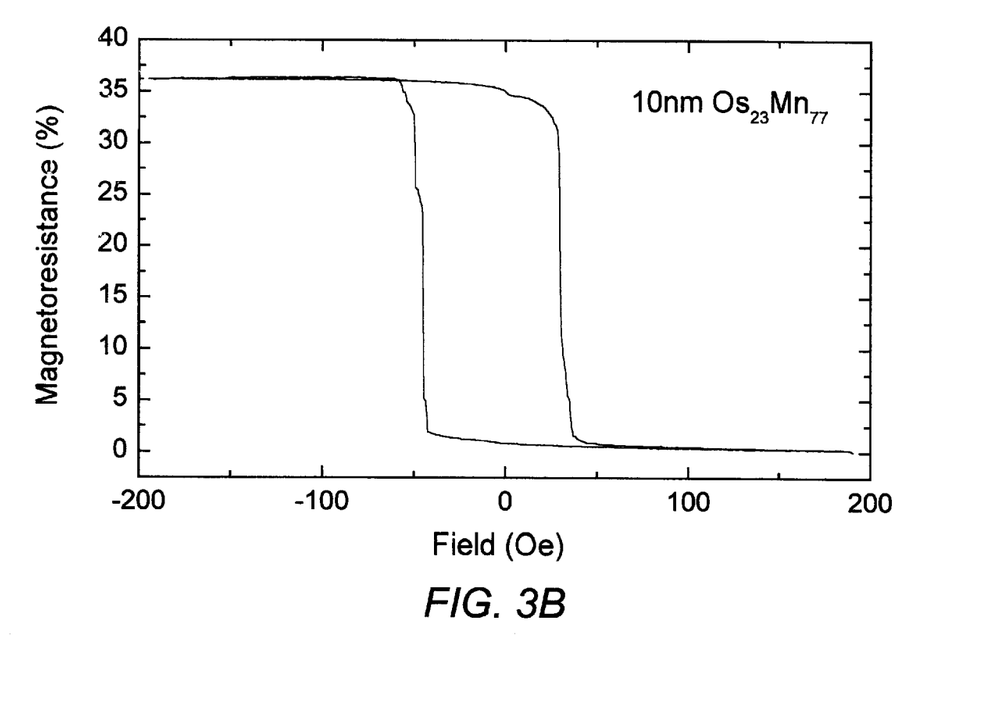
FIG. 3B, is a graph of magnetoresistance as a function of in-plane magnetic field over a range capable of switching only the free layer for a MTJ device with a pinned ferromagnetic layer exchange biased by 10 nm of $Os_{23}Mn_{77}$ formed on a Pt underlayer.

The data in FIG. 2 was obtained with a Quantum Design SQUID magnetometer. The magnetization curve in FIG. 2 displays a superposition of two magnetic hysteresis loops. The magnetic hysteresis loop centered at approximately −300 Oe represents the switching behavior of the pinned ferromagnetic layer comprised of 2.4 nm $Co_{84}Fe_{16}$. The center of this loop is offset from zero field by the exchange bias field. The magnetic hysteresis loop centered at approximately zero field is the free ferromagnetic layer loop. The switching of the free ferromagnetic layer changes the relative orientation of the magnetization of the free ferromagnetic layer with respect to the pinned ferromagnetic layer, thereby resulting in a change in the resistance of the MTJ device, as shown in FIGS. 3A and 3B. In FIG. 3A the magnetic field range is wide enough to switch both the free and pinned ferromagnetic layers whereas in FIG. 3B the magnetic field range is sufficient to switch only the free ferromagnetic layer. The magnetoresistance of this MTJ device was ~36.5% at room temperature. Note that the data in FIG. 2 were obtained on an unpatterned film ~6×2 $(mm)^2$ in area whereas the data in FIGS. 3A–3B were obtained on devices ~40×40 $(\mu m)_2$ in area patterned using metal shadow masks.

The thermal stability of MTJ devices was explored using a specially designed annealing furnace. The furnace is a high vacuum chamber with a base pressure of $5 \times 10^{-8}$ torr. It is capable of heating the sample to temperatures exceeding 400° C. in the presence of an applied magnetic field varying in strength from zero to greater than 6,000 Oe. In addition, the resistance and magnetoresistance of the MTJ devices can be measured in-situ without breaking vacuum. Typically, the sample is submitted to a sequence of anneal treatments consisting of a controlled ramp-up in temperature to the chosen anneal temperature, a soak at this temperature for a set period of time, and a controlled cool-down to a measurement temperature where the resistance and magnetoresistance of the devices are measured. This sequence is repeated as many times as desired.

Figure 4A:
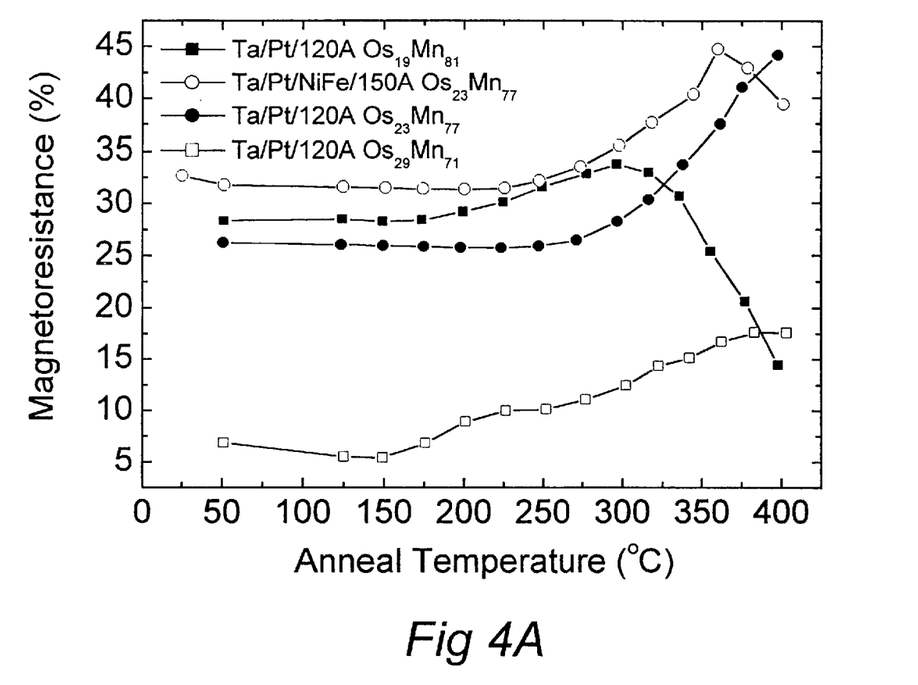
FIGS. 4A and 4B are graphs showing the effect of annealing on the magnetoresistance and resistance, respectively, of MTJ devices exchange biased with $Os_xMn_{1-x}$ for different $Os_xMn_{1-x}$ compositions.
Figure 4B:
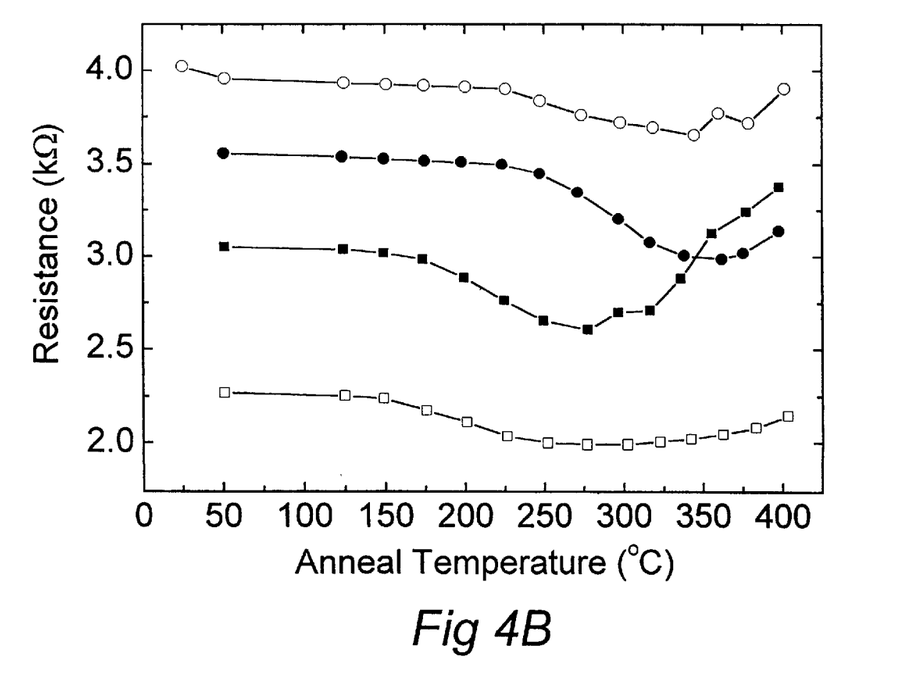

FIGS. 4A–4B show the variation of magnetoresistance and resistance of shadow masked MTJ junctions (with areas of ~40 $\mu m \times 40 \mu m$) as a function of annealing temperature for three MTJ samples exchange biased with Os—Mn with four different compositions. Different symbols represent the different $Os_xMn_{1-x}$ compositions, as listed in the legend. For these data the sample temperature was ramped to the anneal temperature in 40 minutes, soaked at this temperature for 15 minutes, and then cooled to 50° C. where the MTJ transport properties were measured. This sequence was repeated multiple times, as shown in the figures. The data shows that MTJ devices with $Os_xMn_{1-x}$ alloy exchange bias layers have very good thermal stability. The magnetoresistance and the resistance of Os—Mn exchange biased MTJ devices are stable to temperatures exceeding 400° C. Furthermore, for one composition in FIG. 4A ($Os_{23}Mn_{77}$) the magnetoresistance (at 50° C.) of the MTJ device steadily increases during annealing, and after annealing at 400° C. is greater than 45% at room temperature. This is the highest room temperature magnetoresistance yet observed for any MTJ device. For other Os—Mn compositions the magnetoresistance of Os—Mn exchange biased MTJ devices after a series of sequential anneals to 400° C. is not as high but nevertheless still significant.

While the thermal stability of the MTJ devices whose data is shown in FIGS. 4A–4B is very good, the blocking temperature and the exchange bias of MTJ devices with $Os_xMn_{1-x}$ antiferromagnetic layers are not as large as those of similar MTJ devices with $Ir_xMn_{1-x}$ antiferromagnetic layers. The blocking temperatures are less than 450° K with an associated exchange bias of less than 300 Oe (for 2.4 nm $Co_{84}Fe_{16}$ ferromagnetic layers) for the Os—Mn alloys measured. Thus, in the present invention Ir was alloyed with Os—Mn for the purpose of determining whether exchange bias layers with high thermal stability and comparatively high blocking temperatures could be formed.

Figure 5A:
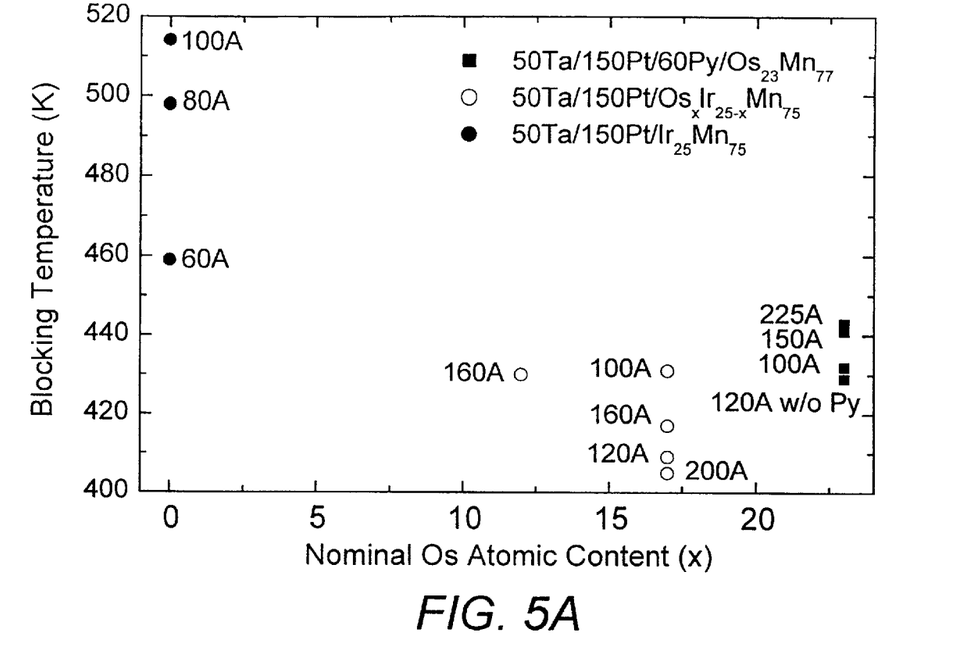
FIG. 5A shows the blocking temperature (degrees Kelvin) of antiferromagnetic layers of different $Os_xIr_yMn_{1-x-y}$ compositions and different thicknesses.
Figure 5B:
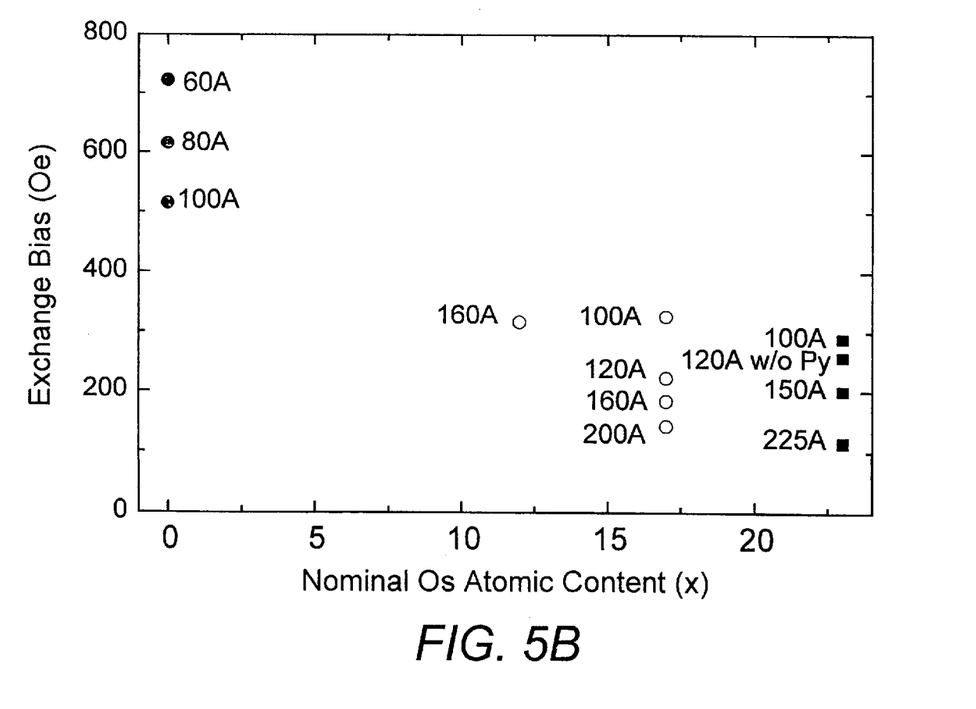
FIG. 5B shows the exchange bias field strength for antiferromagnetic layers of different $Os_xIr_yMn_{1-x-y}$ compositions and different thicknesses.

FIGS. 5A and 5B show the detailed dependence of the influence of the addition of Ir to $Os_xMn_{1-x}$ on blocking temperature and exchange bias, respectively, for various antiferromagnetic layer thicknesses. The blocking temperature and exchange bias measurements were carried out in a SQUID magnetometer. The blocking temperature was determined by measuring the exchange bias field as a function of temperature in the range from 300 to 400° K and then by linear extrapolation to zero exchange bias field. Though the exchange bias shows a definite improvement upon the addition of Ir to $Os_xMn_{1-x}$, the blocking temperature shows only a slight improvement. As is characteristic for Ir—Mn exchange bias layers the blocking temperature of the MTJs with Os—Mn and Os—Ir—Mn exchange bias layers typically increases as the thickness of the antiferromagnetic layer is increased for a given composition (see FIG. 5A), especially for films with thicknesses below ~100 Å, whereas the exchange bias field typically decreases as the antiferromagnet film thickness is increased (see FIG. 5B).

Figure 6A:
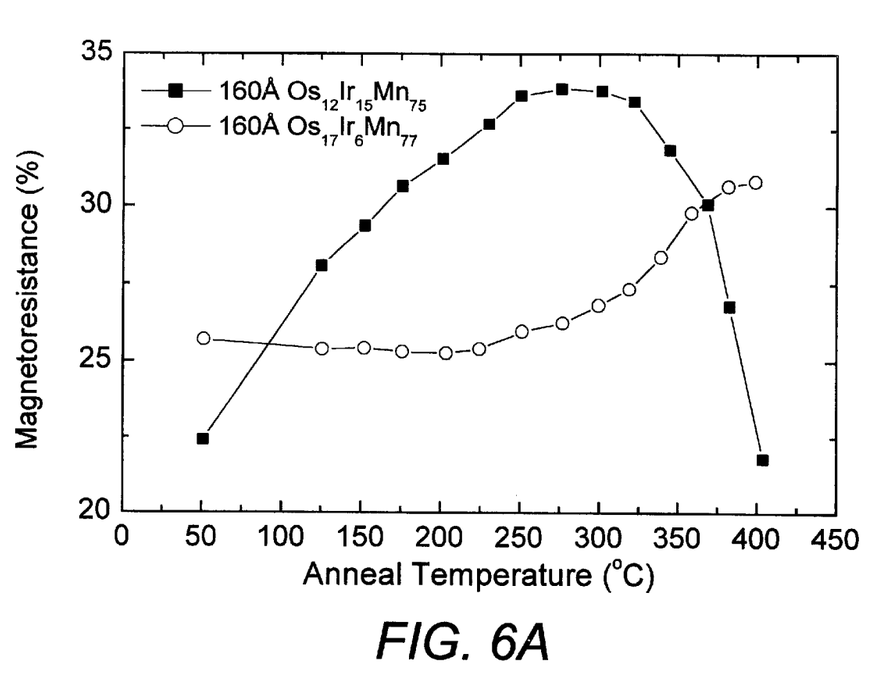
FIGS. 6A and 6B shows the effect of annealing on the magnetoresistance and resistance, respectively, of MTJ devices with pinned ferromagnetic layers exchanged biased with $Os_xIr_yMn_{1-x-y}$ for two different compositions.
Figure 6B:
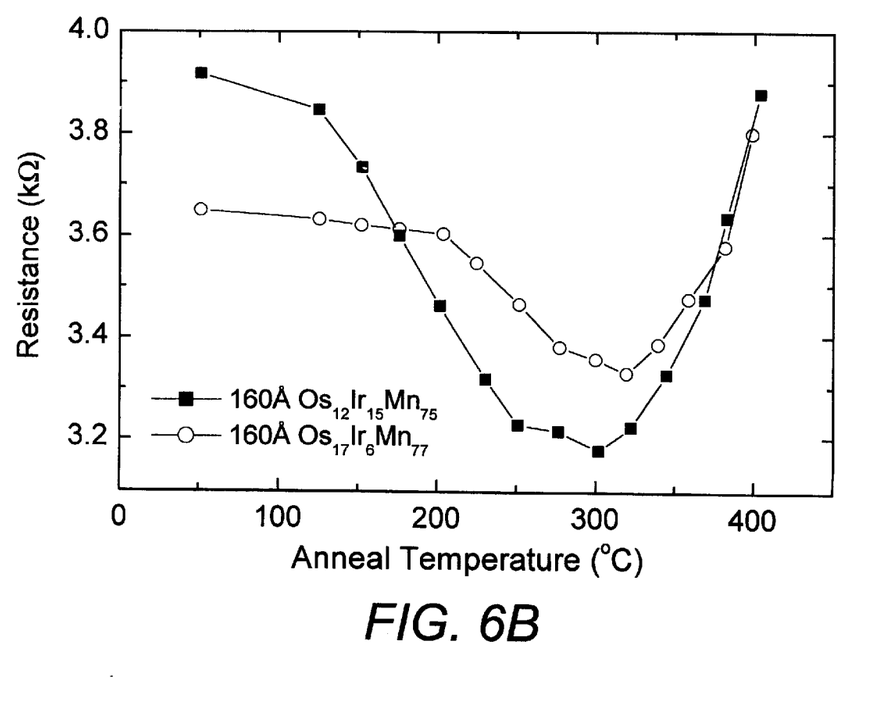

The MTJ devices with $Os_xIr_yMn_{1-x-y}$ alloys were also studied for their thermal stability. FIGS. 6A–6B show the variation of magnetoresistance and resistance of MTJ devices (with areas of ~40 $\mu m \times 40 \mu m$) as a function of annealing temperature for different $Os_xIr_yMn_{1-x-y}$ compositions as listed in the legend. The annealing furnace and the procedure described earlier were used to obtain these results. These results indicate that the MTJ devices with $Os_xIr_yMn_{1-}$ $x$-$y$ alloys have comparable thermal stability to those with $Os_xMn_{1-x}$ alloys.

In addition to Ir, other materials may be alloyed with the Os—Mn alloys. For example, it is within the scope of the present invention to use antiferromagnetic materials of the form Os—Mn—X and Os—Ir—Mn—X, where X can be one or more elements selected from the group consisting of Pt, Pd, Cr, C and B. These alloys are chosen for the following reasons. The corrosion resistance of these alloys is particularly important for MTJ head applications where the MTJ head may have to survive lapping which is used to define the stripe height of the read head. The lapping may involve chemicals which may be injurious to the MTJ device. Similarly, in fabricating MTJ memory cells the sides of the MTJ device may be exposed during part of the process used to define the MTJ memory cell shape and size. Os—Mn and Os—Ir—Mn alloys have higher corrosion resistance than Ir—Mn alloys and therefore, even if these alloys have slightly inferior exchange bias energies or blocking temperatures these materials may be preferred over Ir—Mn alloys themselves. However, notwithstanding the higher corrosion resistance of Os—Mn and Os—Ir—Mn alloys their corrosion resistance may be further improved by the addition of small amounts of other elements, such as Pd, Pt, and Cr. The dependence of blocking temperature and exchange bias field on the thickness of the Os—Mn and Os—Ir—Mn antiferromagnetic layers may be interpreted as follows. As the film thickness of these layers is increased the grain size within these polycrystalline layers is also increased. Larger grains lead to larger volumes of coherent antiferromagnetic material and therefore higher blocking temperatures since the latter depends on the total magnetocrystalline energy of these magnetically coherent units. On the other hand, within certain theoretical models to account for the exchange bias effect, the larger the coherent antiferromagnetic regions at the interface between the ferromagnetic layer and the antiferromagnetic layer the smaller is the exchange bias because of the greater likelihood of magnetic compensation of the antiferromagnetically coupled magnetic moments within the antiferromagnetic interface layer. The size of the antiferromagnetic coherent regions may be decreased by the addition of elements which reduce the grain size of the antiferromagnetic material, for example, by the addition of boron (B) or carbon (C) or other elements which will reduce the grain size or effective grain size of the antiferromagnetic layer.

Figure 7:
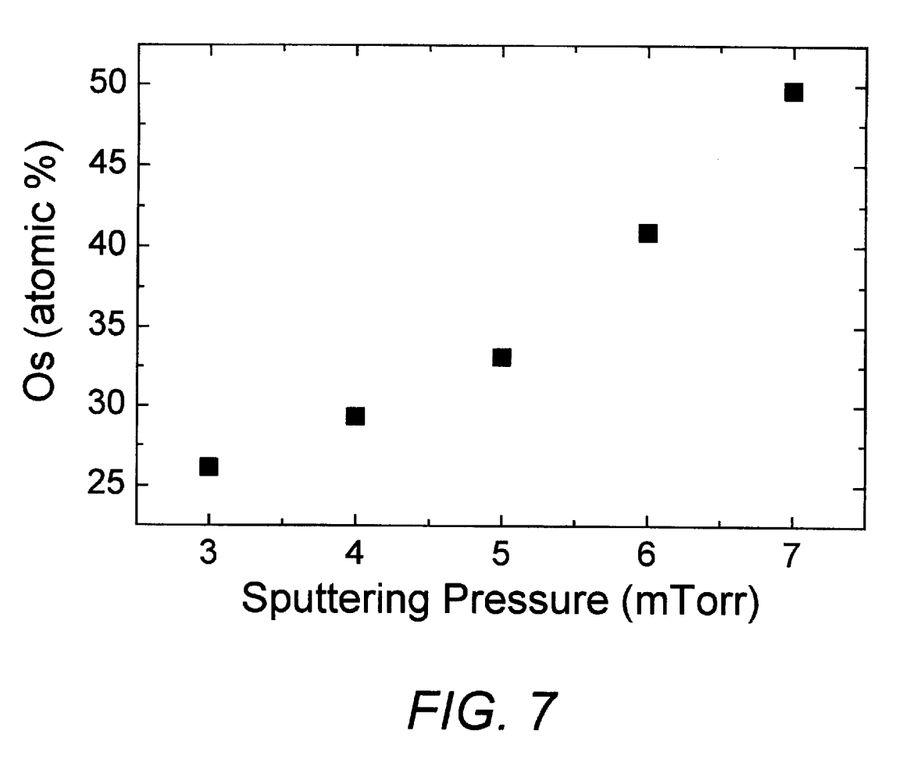
FIG. 7 is a graph of Os concentration in $Os_xMn_{1-x}$ alloy films as a function of sputtering pressure for $Os_xMn_{1-x}$ films sputter deposited from a $Os_{20}Mn_{80}$ sputtering target.

In FIGS. 4A–4B the data for $Os_xMn_{1-x}$ exchange bias layers with x ranging from 19 to 29 atomic percent are shown. These alloys display significant exchange bias whose magnitude is only weakly dependent on the Os—Mn composition. The Os—Mn composition was varied by using different sputtering targets fabricated with different Os—Mn compositions. Typically the composition of the sputtered material was not the same as the composition of the sputtering target and the composition of the sputtered material was higher in Os content than the sputtering target. The composition of the Os in the film could also be varied by varying the sputtering pressure used to deposit the Os—Mn material. For example, using a sputtering target of nominal composition $Os_{20}Mn_{80}$ the composition of the OsMn alloy in the sputtered film could be varied from ~26 atomic % Os to nearly 50 atomic % Os, as shown in FIG. 7. Only the Os—Mn films prepared at 3 and 4 mTorr in FIG. 7 exhibited exchange bias. By using these methods a wide range of Os—Mn and Os—Ir—Mn alloys were studied. The useful range of these alloys has been determined to be from about ~10 to ~30 atomic % Os or Os—Ir. For higher concentrations than ~30 atomic % Os or Os—Ir no exchange bias is observed, most likely because these alloys are not antiferromagnetic above room temperature. For lower concentrations of Os or Os—Ir the sputtering targets become extremely brittle and it is difficult to work with such materials. Moreover, the corrosion resistance decreases with increasing Mn concentration, making these materials less suitable.

Thus MTJ devices with Pt underlayers with antiferromagnetic layers of $Os_xMn_{1-x}$ (x approximately 10–30 atomic percent), and $Os_xIr_yMn_{1-x-y}$ (x+y in the range of approximately 10–30 atomic percent) show excellent thermal stability for anneal temperature up to at least 400° C. For example, an MTJ device with an antiferromagnetic layer of $Os_{23}Mn_{77}$ and a Pt underlayer exhibits more than 40% magnetoresistance at 50° C. even after a sequence of 30 minute anneals at temperatures from 50° C. to 400° C. in 25° C. steps (FIG. 4A). Moreover, the resistance of the MTJ device is only approximately 10% changed from its initial resistance prior to the sequence of anneals (FIG. 4B). Thus it is possible to fabricate MTJ devices which are stable to annealing temperatures exceeding 400° C. without a significant change in the resistance of the MTJ and with improved magnetoresistance compared to the magnetoresistance prior to any anneal treatments. Using such highly thermally stable MTJ devices makes possible the integration of MTJ memory cells for use with CMOS electronics.

The use of a noble metal underlayer is important to the present invention because such materials have the required combination of properties, as follows. The underlayer forms the template or seed layer for the antiferromagnetic layer and must allow a suitable growth of the antiferromagnetic layer. The template layer must not interdiffuse or chemically react with the antiferromagnetic layer. The layer must not react or interdiffuse with insulating material which will surround the MTJ device. The underlayer must not react with the layer on which it is deposited. For these reasons a noble metal layer is preferred. While Pt was used as the noble metal underlayer for the Os—Mn alloy antiferromagnetic layers of the present invention, other underlayers that may be used include Pd and alloys of Pt or Pd. In addition, a permalloy (Ni–Fe) template layer may be formed on the Pt or Pd underlayer to facilitate the formation of the Os—Mn alloy antiferromagnetic layers. Data for a sample with such a template layer is shown in FIGS. 4A–4B.

The antiferromagnetically exchange-coupled structure comprising the pinned ferromagnetic layer and the antiferromagnetic exchange biasing layer according to the present invention has been described above with primary application to MTJs for use as memory cells in MRAM arrays and in magnetoresistive recording read heads. However, the invention is also applicable to spin-valve type giant magnetoresistance (GMR) recording heads, wherein the ferromagnetic layers are separated by a thin non-ferromagnetic metallic layer, and wherein the sense current is usually applied parallel to the planes of the layers comprising the spin-valve head. Dual spin-valve GMR heads, of the type described in IBM's U.S. Pat. No. 5,287,238, have an antiferromagnetically exchange-coupled structure located on the "bottom" of the head, i.e., on the substrate. When used in these GMR heads, the present invention can also be used as the antiferromagnetically exchange-coupled structure, provided the noble metal underlayer for the Os—Mn or Os—Ir—Mn antiferromagnetic layer is made thin enough so as to not shunt the sense current.

While the present invention has been particularly shown and described with reference to the preferred embodiments, it will be understood by those skilled in the art that various changes in form and detail may be made without departing from the spirit and scope of the invention. Accordingly, the disclosed invention is to be considered merely as illustrative and limited in scope only as specified in the appended claims.

What is claimed is:

1. An antiferromagnetically exchange-coupled structure for use in a magnetic device of the type having a substrate and a plurality of ferromagnetic layers formed on the substrate, the structure comprising.
   an underlayer on the substrate, the underlayer being a material selected from the group consisting of Pt, Pd, and alloys of Pt or Pd;
   an antiferromagnetic layer on the underlayer, the antiferromagnetic layer being a material comprising $Os_x Mn_{1-x}$, where x is between approximately 10 and 30 atomic percent; and
   a ferromagnetic layer on and in contact with the antiferromagnetic layer, the ferromagnetic layer having its magnetic moment pinned by being exchange biased with the antiferromagnetic layer.

2. The structure according to claim 1 further comprising an adhesion layer of Ta or Ti directly on the substrate, and wherein the underlayer is directly on the adhesion layer.

3. The structure according to claim 1 further comprising a template layer of Ni—Fe between the underlayer and the antiferromagnetic layer.

4. The structure according to claim 1 wherein the antiferromagnetic material includes Ir, and wherein x represents the total of Os and Ir in atomic percent.

5. The structure according to claim 1 wherein the antiferromagnetic material further comprises one or more elements selected from the group consisting of Pt, Pd, Cr, C and B, and wherein x represents the total of Os and the elements selected from the group consisting of Pt, Pd, Cr, C and B in atomic percent.

6. A magnetic tunnel junction device on a substrate, the device comprising:
   an antiferromagnetic layer of material comprising $Os_x Mn_{1-x}$, where x is between approximately 10 and 30 atomic percent, the antiferromagnetic layer being formed on an underlayer formed of material that does not chemically react with the material of the antiferromagnetic layer;
   a pinned ferromagnetic layer on and in contact with the antiferromagnetic layer, whereby the pinned ferromagnetic layer has its magnetic moment fixed by being exchange biased with the antiferromagnetic layer;
   a free ferromagnetic layer having a magnetic moment free to rotate relative to the moment of the pinned ferromagnetic layer in the presence of an applied magnetic field; and
   an insulating tunneling layer located between and in contact with the pinned ferromagnetic layer and the free ferromagnetic layer for permitting tunneling current between the pinned ferromagnetic layer and the free ferromagnetic layer.

7. The magnetic tunnel junction device according to claim 6 wherein the underlayer is formed of a material selected from the group consisting of Pt, Pd and alloys of Pt or Pd.

8. The magnetic tunnel junction device according to claim 7 further comprising an adhesion layer of Ta or Ti directly on the substrate, and wherein the underlayer is directly on the adhesion layer.

9. The magnetic tunnel junction device according to claim 6 further comprising a template layer of Ni—Fe between the underlayer and the antiferromagnetic layer.

10. The magnetic tunnel junction device according to claim 6 wherein the antiferromagnetic material includes Ir, and wherein x represents the total of Os and Ir in atomic percent.

11. The magnetic tunnel junction device according to claim 6 wherein the antiferromagnetic material further comprises one or more elements selected from the group consisting of Pt, Pd, Cr, C and B, and wherein x represents the total of Os and the elements selected from the group consisting of Pt, Pd, Cr, C and B in atomic percent.

12. The magnetic tunnel junction device according to claim 6 wherein the magnetic moment of the free ferromagnetic layer is oriented substantially parallel or antiparallel to the magnetic moment of the pinned ferromagnetic layer in the absence of an applied magnetic field.

13. The magnetic tunnel junction device according to claim 6 further comprising a substrate, and wherein the underlayer, antiferromagnetic layer, pinned ferromagnetic layer, insulating tunneling layer and free ferromagnetic layer are formed on the substrate, whereby tunneling current passes through the insulating tunneling layer in a direction generally perpendicular to the pinned ferromagnetic layer and free ferromagnetic layer when the pinned ferromagnetic layer and free ferromagnetic layer are connected to electrical circuitry.

14. A nonvolatile magnetic memory array of magnetic tunnel junction memory cells comprising:
   a substrate;
   a first set of electrically conductive lines formed on the substrate;
   a second set of electrically conductive lines formed on the substrate and intersecting the first set of lines to define a plurality of intersection regions;
   an array of magnetic tunnel junction cells, each cell being formed at an intersection region on the substrate and comprising a magnetic tunnel junction device as claimed in claim 6.

15. A magnetic tunnel junction device comprising:
   a substrate;
   an underlayer on the substrate, the underlayer being a material selected from the group consisting of Pt, Pd and alloys of Pt or Pd;
   an antiferromagnetic layer on the underlayer, the antiferromagnetic layer being a material comprising $Os_x Mn_{1-x}$, where x is between approximately 10 and 30 atomic percent;
   a pinned ferromagnetic layer on and in contact with the antiferromagnetic layer, the pinned ferromagnetic layer having its magnetic moment fixed by being exchange biased with the antiferromagnetic layer;
   an insulating tunneling layer on and in contact with the pinned ferromagnetic layer; and
   a free ferromagnetic layer on and in contact with the insulating tunneling layer and having a magnetic moment oriented substantially parallel or antiparallel to is the magnetic moment of the pinned ferromagnetic layer in the absence of an applied magnetic field.

16. The magnetic tunnel junction device according to claim 15 further comprising an adhesion layer of Ta or Ti directly on the substrate, and wherein the underlayer is directly on the adhesion layer.

17. The magnetic tunnel junction device according to claim 15 further comprising a template layer of Ni—Fe between the underlayer and the antiferromagnetic layer.

18. The magnetic tunnel junction device according to claim 15 wherein the antiferromagnetic material includes Ir, and wherein x represents the total of Os and Ir in atomic percent.

19. The magnetic tunnel junction device according to claim 15 wherein the antiferromagnetic material further comprises one or more elements selected from the group consisting of Pt, Pd, Cr, C and B, and wherein x represents the total of Os and the elements selected from the group consisting of Pt, Pd, Cr, C and B in atomic percent.

* * * * *